US012727239B2

(12) United States Patent
Chu et al.

(10) Patent No.: US 12,727,239 B2
(45) Date of Patent: Sep. 1, 2026

(54) SEMICONDUCTOR TRANSISTOR ARRAYS

(71) Applicant: INTERNATIONAL BUSINESS MACHINES CORPORATION, Armonk, NY (US)

(72) Inventors: Albert M. Chu, Nashua, NH (US); Ruilong Xie, Niskayuna, NY (US); Brent A. Anderson, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 806 days.

(21) Appl. No.: 18/150,814

(22) Filed: Jan. 6, 2023

(65) Prior Publication Data

US 2024/0234415 A1 Jul. 11, 2024

(51) Int. Cl.

| | |
|---|---|
| ***H10D 84/83*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |
| ***H10P 50/00*** | (2026.01) |

(52) U.S. Cl.

CPC ......... *H10D 84/834* (2025.01); *H10D 64/017* (2025.01); *H10D 84/0135* (2025.01); *H10D 84/0172* (2025.01); *H10D 84/038* (2025.01); *H10D 84/853* (2025.01); *H10P 50/71* (2026.01)

(58) Field of Classification Search

CPC ............... H10D 84/834; H10D 84/853; H10D 84/0172; H10D 84/038; H10D 64/017

See application file for complete search history.

(56) References Cited

U.S. PATENT DOCUMENTS

| | | | | |
|---|---|---|---|---|
| 5,780,883 | A * | 7/1998 | Tran | H10D 84/907 257/206 |
| 7,327,591 | B2 | 2/2008 | Sadra | |
| 8,609,523 | B2 | 12/2013 | Forbes | |
| 9,147,439 | B2 | 9/2015 | Cernea | |
| 9,787,260 | B2 | 10/2017 | Lehtola | |
| 2005/0281098 | A1* | 12/2005 | Sadra | H10B 10/12 365/194 |
| 2013/0095650 | A1 | 4/2013 | Shimomura | |
| 2022/0059460 | A1* | 2/2022 | Do | H01L 23/485 |

OTHER PUBLICATIONS

Bogaerts et al., "CMOS image sensor with two-shared pixel and staggered readout architecture", 2009 International Image Sensor Worshop, Jun. 26-28, 2009 Bergen, Norway, 8 pages.

* cited by examiner

*Primary Examiner* — Christine A Enad

(74) *Attorney, Agent, or Firm* — Yuanmin Cai

(57) ABSTRACT

Embodiments of present invention provide a semiconductor structure, which includes a first row of transistor array; and a second row of transistor array, the second row of transistor array being adjacent to and parallel to the first row of transistor array, where gates of the first row of transistor array are not aligned with gates of the second row of transistor array. A method of forming the same is also provided.

11 Claims, 10 Drawing Sheets

X1
X2
X3
401

X
Y
Z
10
401
301
201
101
X3

401
301
201
101
X2

401
301
201
101
X1

X1
X2
X3
402
202
503
203
703
701
702
704

503
303
203
101
X3
503

402
302
202
101
X2
402
402

402
302
202
101
X1
402
402

Z
Y
X

SEMICONDUCTOR TRANSISTOR ARRAYS

BACKGROUND

The present application generally relates to manufacturing of semiconductor integrated circuits. More particularly, it relates to method of manufacturing semiconductor transistor arrays and the structure manufactured thereby.

With the ever-increasing demand for increasing density of semiconductor devices, dimensions of various semiconductor devices such as logic transistors have been shrinking dramatically. In the meantime, layout of the logic transistors and their arrays also plays an important role in affecting and ultimately deciding the overall usage of space in a designated transistor area in a chip or substrate. For example, with the current manufacturing process of standard transistor cells, gate structures are normally first formed for various transistors that may include transistors in two neighboring cells. A gate-cut process is then applied to cut the gate structures into gates for transistors in the two neighboring cells. However, due to this gate-cut process, a gate-cute area between the cells may be created that are not otherwise used and unnecessarily have increased the spacing between the cells.

SUMMARY

Embodiments of present invention provide a semiconductor structure. The semiconductor structure includes a first row of transistor array; and a second row of transistor array, the second row of transistor array being adjacent to and parallel to the first row of transistor array, wherein gates of the first row of transistor array are not aligned with gates of the second row of transistor array.

In one embodiment, the semiconductor structure further includes a third row of transistor array that is adjacent to and parallel to the first row of transistor array and shares the gates of the first row of transistor array, where a first distance between the first row of transistor array and the second row of transistor array is shorter than a second distance between the first row of transistor array and the third row of transistor array.

In another embodiment, the semiconductor structure further includes a fourth row of transistor array that is adjacent to and parallel to the second row of transistor array and shares the gates of the second row of transistor array, where the first distance between the first row of transistor array and the second row of transistor array is shorter than a third distance between the second row of transistor array and the fourth row of transistor array.

According to one embodiment, transistors in the first row of transistor array have a same polarity as transistors in the second row of transistor array and have a different polarity from transistors in the third row of transistor array.

According to another embodiment, the gates of the first row of transistor array partially overlap, in a horizontal direction, with the gates of the second row of transistor array.

According to yet another embodiment, the gates of the first row of transistor array includes a first gate and a second gate that are separated by a first distance, the gates of the second row of transistor array includes a third gate that has a second distance from the first gate of the first row of transistor array, where the second distance equals half of the first distance.

According to a further embodiment, the first row of transistor array includes at least a first edge cell, and the second row of transistor array includes at least a second edge cell, the first edge cell and the second edge cell are aligned at a block level boundary.

Embodiments of present invention also provide a method of forming a semiconductor structure. The method includes providing a semiconductor substrate, the substrate having first, second, third, and fourth substrate regions that are parallel to each other; forming a first set of gate masks on a first portion of the substrate; forming a second set of gate masks on a second portion of the substrate, wherein the second portion of the substrate partially overlaps with the first portion of the substrate and wherein gate masks of the second set of gate masks situate between gate masks of the first set of gate masks to partially overlap, in a horizontal direction, with the gate masks of the first set of gate masks; forming a first set of dummy gates using the first set of gate masks and a second set of dummy gates using the second set of gate masks; and finishing forming the semiconductor structure.

In one embodiment, the method further includes forming a gate cut mask to expose a portion of the second set of gate masks that are situated between the gate masks of the first set of gate masks; and removing the exposed portion of the second set of gate masks in a selective etching process.

According to one embodiment, forming the second set of gate masks includes forming the second set of gate masks in a material that has an etch selectivity different from an etch selectivity of a material of the first set of gate masks.

According to another embodiment, the first set of gate masks is placed above the first and third substrate regions of the substrate, and the second set of gate masks is placed above the second and fourth substrate regions of the substrate.

According to yet another embodiment, the first substrate region has a first distance from the second substrate region and a second distance from the third substrate region, and the first distance is shorter than the second distance.

In one embodiment, finishing forming the semiconductor structure further includes forming a first row of transistor array of n-type using the first substrate region and forming a third row of transistor array of p-type using the third substrate region, transistors in the first row of transistor array and transistors in the third row of transistor array share a first set of gates formed from the first set of gate masks.

In another embodiment, finishing forming the semiconductor structure further includes forming a first row of transistor array of n-type using the first substrate region and forming a second row of transistor array of n-type using the second substrate region, transistors in the first row of transistor array share a first set of gates formed from the first set of gate masks and transistors in the second row of transistor array share a second set of gates formed from the second set of gate masks.

BRIEF DESCRIPTION OF THE DRAWINGS

The present invention will be understood and appreciated more fully from the following detailed description of embodiments of present invention, taken in conjunction with accompanying drawings of which.

Figures 1A, 1B, 1C, 1D:
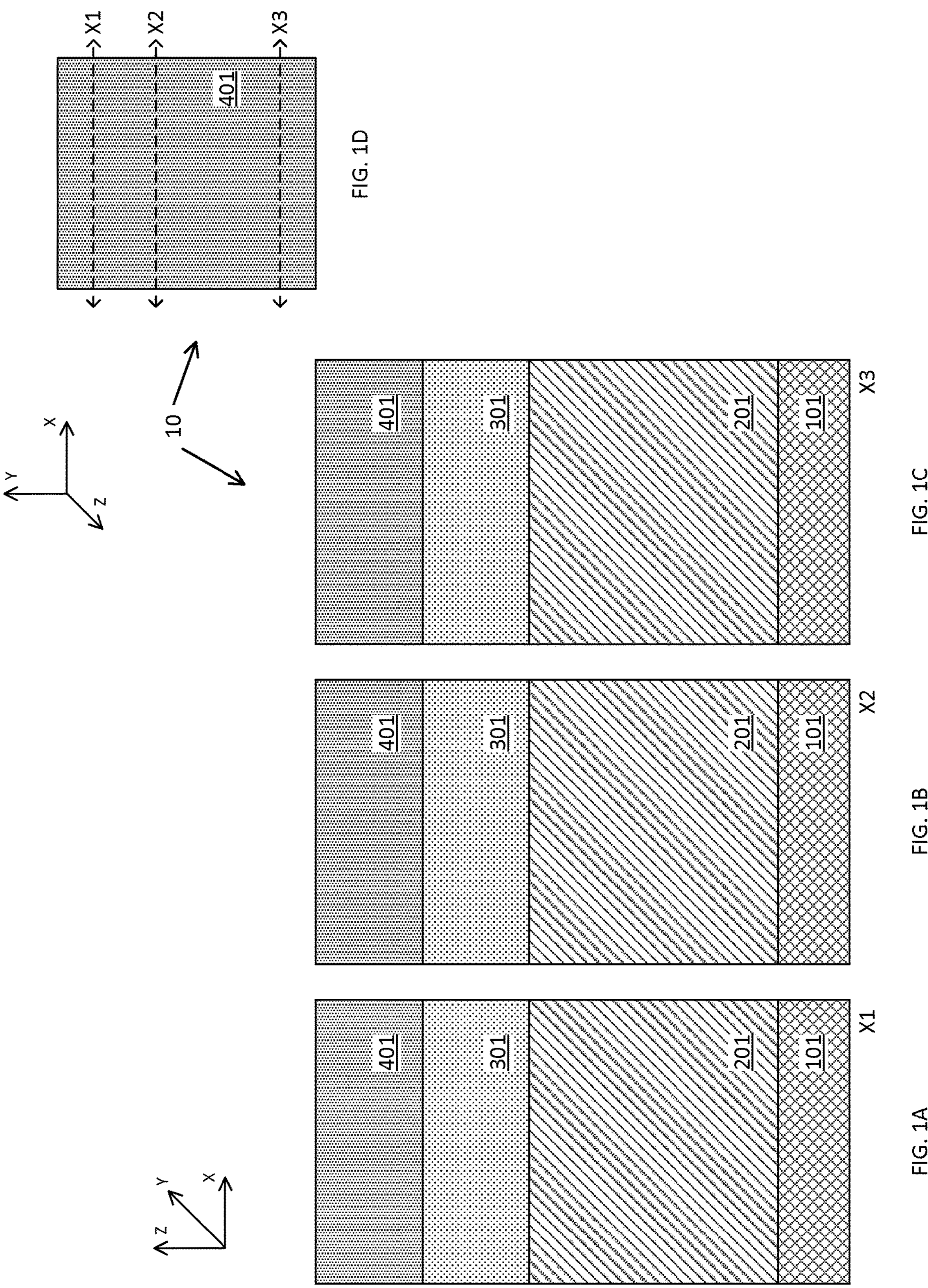
FIGS. 1A, 1B, and 1C are demonstrative illustrations of cross-sectional views
FIG. 1D is a demonstrative illustration of a top view of a semiconductor structure in a step of manufacturing thereof according to embodiments of a method of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIGS. 1A, 1B, and 1C are demonstrative illustrations of cross-sectional views and FIG. 1D is a simplified illustration of top view of a semiconductor structure in a step of manufacturing thereof according to one embodiment of present invention. More specifically, with reference to FIG. 1D of the simplified illustration of top view, FIG. 1A illustrates a cross-sectional view of a semiconductor structure 10 made along a dashed line X1; FIG. 1B illustrates a cross-sectional view of the semiconductor structure 10 made along a dashed line X2; and FIG. 1C illustrates a cross-sectional view of the semiconductor structure 10 made along a dashed line X3, all in a direction perpendicular to the gates of different transistor arrays (to be formed). As will be made clear later (e.g., see FIG. 8D), the dashed lines X1, X2, and X3 are made along three separate substrate regions designated for forming three different transistor arrays.

More particularly, embodiments of present invention provide providing or receiving a semiconductor substrate 101; forming a blanket dummy gate layer 201 on top of the semiconductor substrate 101; forming a blanket gate hard-mask layer 301 on top of the blanket dummy gate layer 201; and forming a blanket top hard-mask layer 401 on top of the blanket gate hard-mask layer 301. The semiconductor substrate 101 may be a silicon (Si) substrate, a silicon-germanium (SiGe) substrate; a silicon-on-insulator (SOI) substrate or any other suitable substrates and may include or be divided to include various substrate regions. In one embodiment, the semiconductor substrate 101 may be a nanosheet for forming a nanosheet transistor or may be a fin-shaped substrate for forming a fin-type transistor. In another embodiment, the blanket dummy gate layer 201 may be an amorphous silicon layer or other suitable sacrificial material layer; the blanket gate hard-mask layer 301 may be, for example, a layer of silicon-nitride (SiN); and the blanket top hard-mask layer 401 may be, for example, an amorphous silicon (a-Si) layer.

Figures 2A, 2B, 2C, 2D:
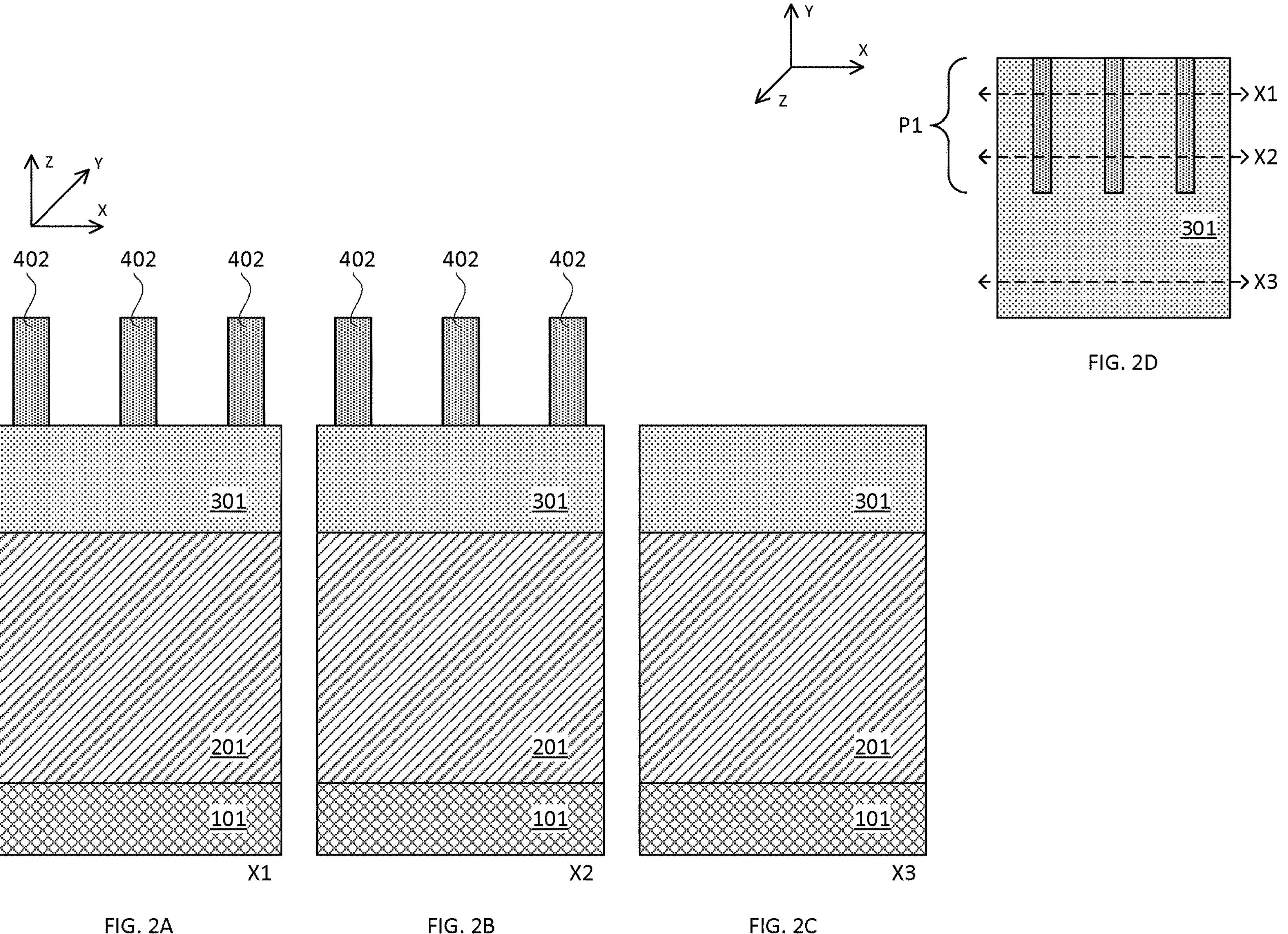
FIGS. 2A, 2B, and 2C are demonstrative illustrations of cross-sectional views
FIG. 2D is a demonstrative illustration of a top view of a semiconductor structure in a step of manufacturing thereof according to embodiments of a method of present invention.

FIGS. 2A, 2B, and 2C are demonstrative illustrations of cross-sectional views and FIG. 2D is a simplified illustration of top view of a semiconductor structure in a step of manufacturing thereof according to one embodiment of present invention. More specifically, following the step illustrated in FIGS. 1A-1D, embodiments of present invention provide patterning the top hard-mask layer 401 into a first set of top hard-masks 402 through a lithographic patterning and etching process. As is illustrated in FIG. 2D, the first set of top hard-masks 402 may be formed vertically over a first portion P1 of the semiconductor substrate 101 whose cross-sections are illustrated in FIG. 2A and FIG. 2B. In the meantime, the blanket gate hard-mask layer 301 may be exposed wherever the first set of top hard-masks are not formed.

Figures 3A, 3B, 3C, 3D:
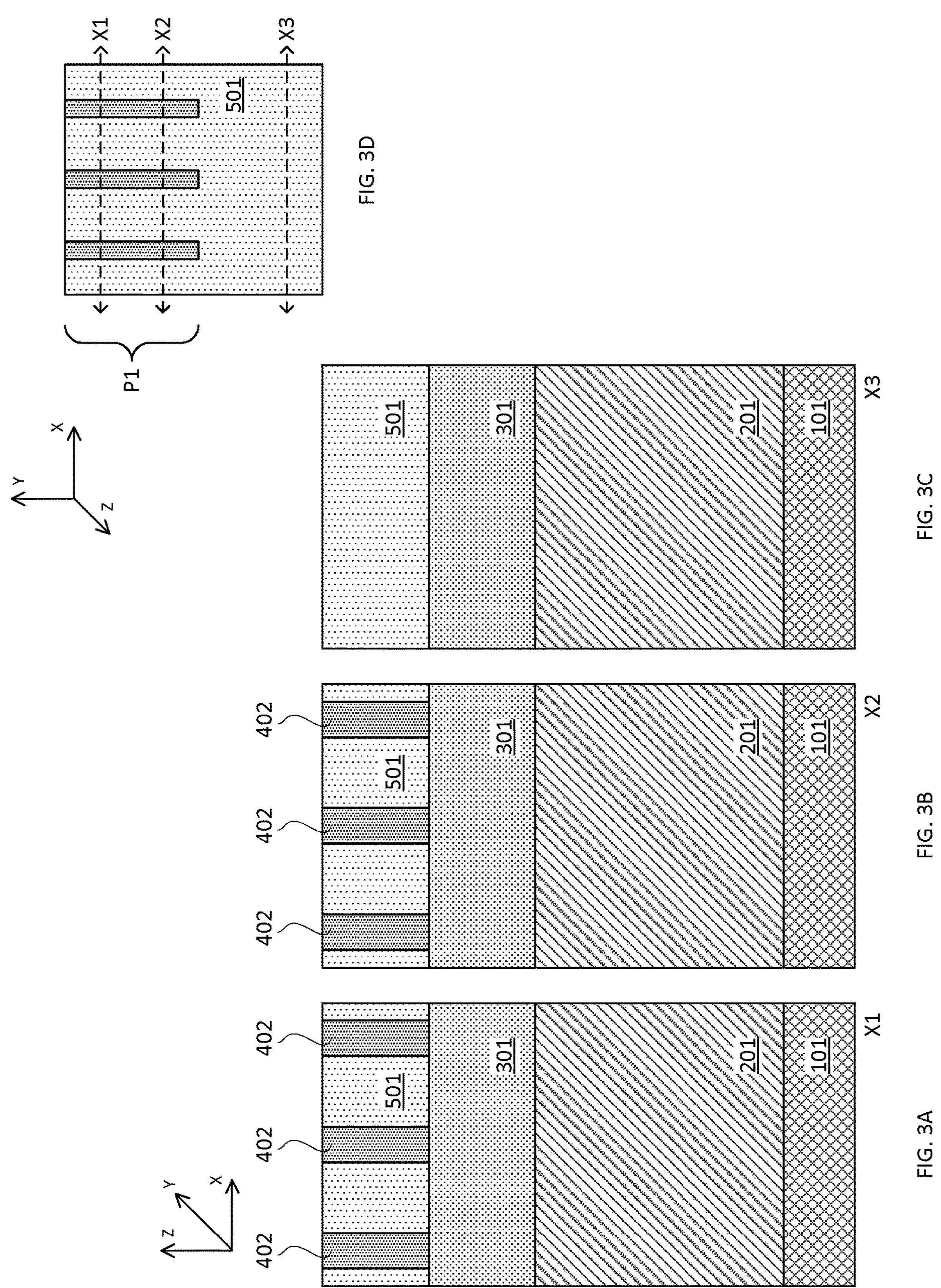
FIGS. 3A, 3B, and 3C are demonstrative illustrations of cross-sectional views
FIG. 3D is a demonstrative illustration of a top view of a semiconductor structure in a step of manufacturing thereof according to embodiments of a method of present invention.

FIGS. 3A, 3B, and 3C are demonstrative illustrations of cross-sectional views and FIG. 3D is a simplified illustration of top view of a semiconductor structure in a step of manufacturing thereof according to one embodiment of present invention. More specifically, following the step illustrated in FIGS. 2A-2D, embodiments of present invention provide depositing a new top hard-mask layer 501 on top of the exposed blanket gate hard-mask layer 301, and on top of and in-between the first set of top hard-masks 402. The new top hard-mask layer 501 may be a dielectric material layer to have a different etch selectivity from the first set of top hard-masks 402 and from the blanket gate hard-mask layer 301. For example, in one embodiment, the new top hard-mask layer 501 may be an oxide material layer that has a different etch selectivity from the amorphous silicon of the first set of top hard-masks 402 and from the silicon-nitride of the blanket gate hard-mask layer 301. Embodiments of present invention further provide applying a planarization process, such as a chemical-mechanic-polishing (CMP) process, to planarize a top surface of the new top hard-mask layer 501 and expose the first set of top hard-masks 402.

Figures 4A, 4B, 4C, 4D:
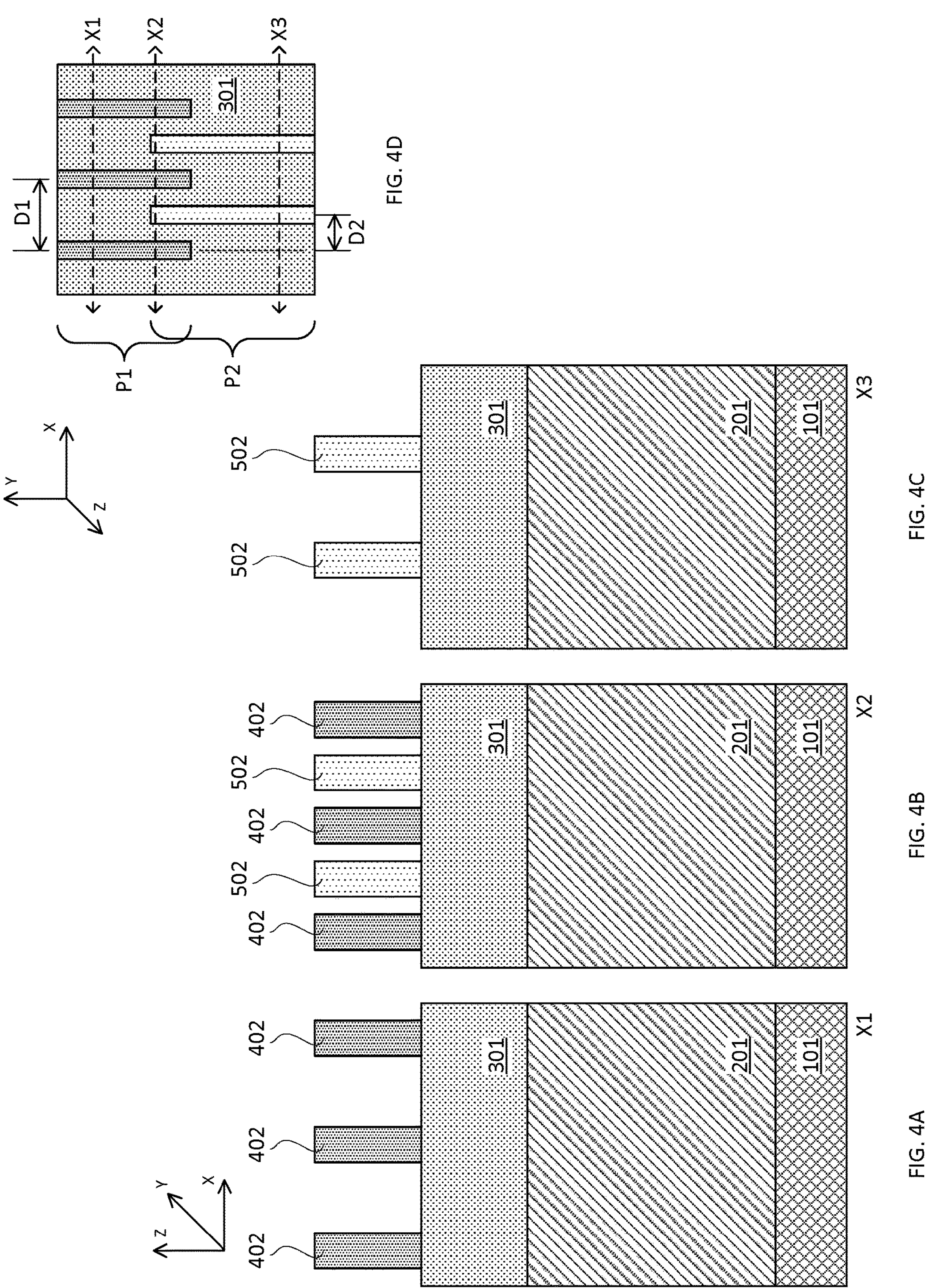
FIGS. 4A, 4B, and 4C are demonstrative illustrations of cross-sectional views
FIG. 4D is a demonstrative illustration of a top view of a semiconductor structure in a step of manufacturing thereof according to embodiments of a method of present invention.

FIGS. 4A, 4B, and 4C are demonstrative illustrations of cross-sectional views and FIG. 4D is a simplified illustration of top view of a semiconductor structure in a step of manufacturing thereof according to one embodiment of present invention. More specifically, following the step illustrated in FIGS. 3A-3D, embodiments of present invention provide patterning the new top hard-mask layer 501 into a second set of top hard-masks 502 through a lithographic patterning and etching process. As is illustrated in FIG. 4D, the second set of top hard-masks 502 may be formed vertically over a second portion P2 of the semiconductor substrate 101 whose cross-sections are illustrated in FIG. 4B and FIG. 4C. The second portion P2 of the semiconductor substrate 101 may have an overlap portion with the first portion P1 of the semiconductor substrate 101. In other words, the first portion P1 and second portion P2 of the semiconductor substrate 101 may partially overlap with each other. Top hard-masks 502 in the second set of top hard-masks may not be aligned vertically with the top hard-masks 402 and may be formed in between the first set of top hard-masks 402. In other words, the second set of top hard-masks 502 may be staggered with the first set of top hard-masks 402. For example, two adjacent or neighboring top hard-masks 402 in the first set of top hard-masks may be separated by a first distance D1, and a top hard-mask 502 in the second set of top hard-masks may be separated, horizontally, from one of the top hard-masks 402 by a second distance D2, and D1 and D2 are generally different. In one embodiment, D2 may be equal to half of D1.

Figures 5A, 5B, 5C, 5D:
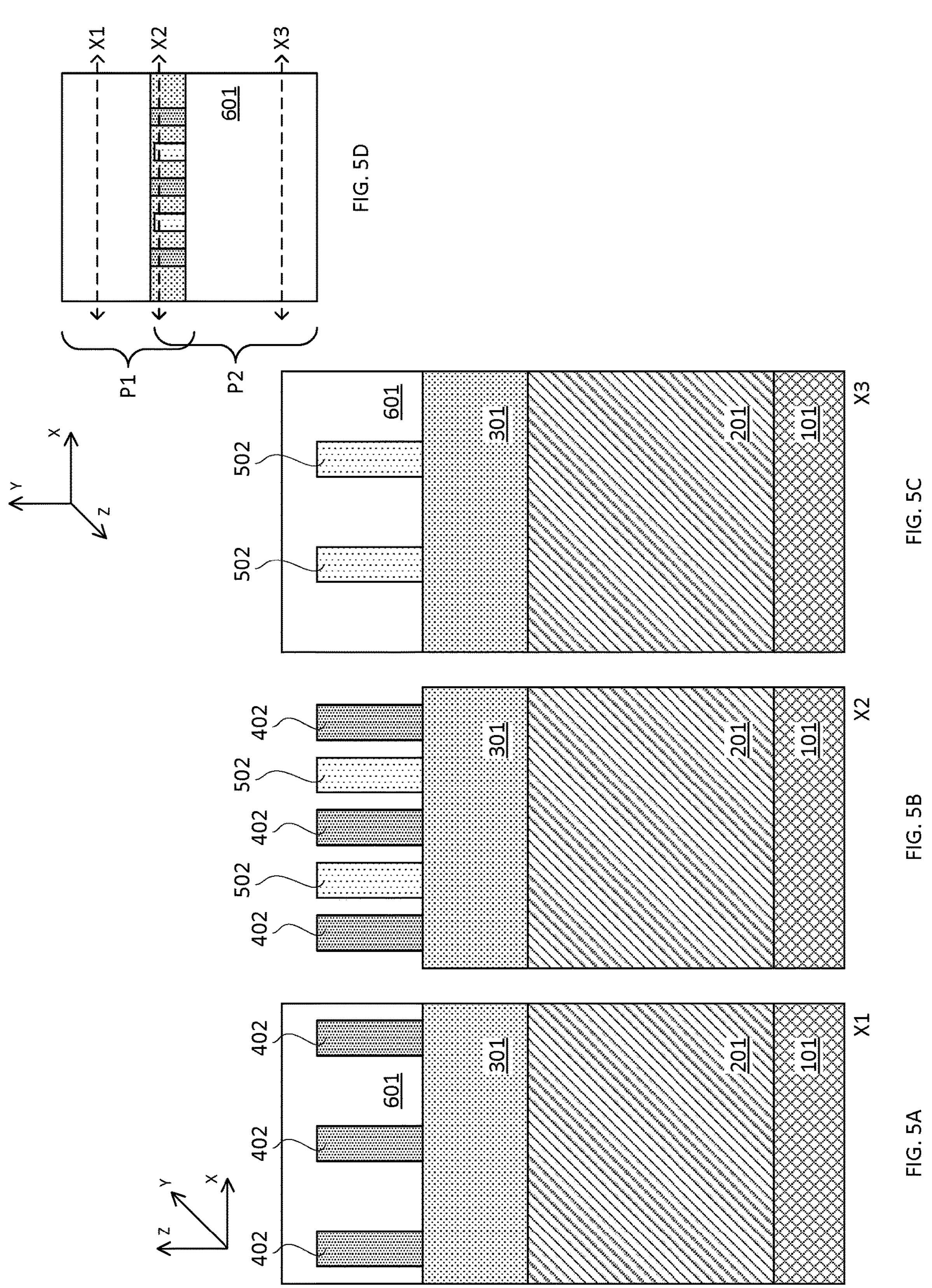
FIGS. 5A, 5B, and 5C are demonstrative illustrations of cross-sectional views
FIG. 5D is a demonstrative illustration of a top view of a semiconductor structure in a step of manufacturing thereof according to embodiments of a method of present invention.

FIGS. 5A, 5B, and 5C are demonstrative illustrations of cross-sectional views and FIG. 5D is a simplified illustration of top view of a semiconductor structure in a step of manufacturing thereof according to one embodiment of present invention. More specifically, following the step illustrated in FIGS. 4A-4D after forming the first and second sets of top hard-masks 402 and 502, embodiments of present invention provide performing a gate-cut process to selectively cut or remove at least a portion of either the first set of top hard-masks 402 or the second set of top hard-masks 502 that horizontally overlap with each other. For example, a portion of the second set of top hard-masks 502 may be removed or cut and in order to do so, embodiments of present invention provide forming a gate-cut mask 601 that exposes a tip portion of the second set of top hard-masks 502. The gate-cut mask 601 may be formed by forming, for example, an organic planarization layer (OPL) on top of the first and second sets of top hard-masks 402 and 502 and patterning a cut opening in the OPL to form the gate-cut mask 601. The gate-cut mask 601 may be formed to cover rest of the second set of top hard-masks 502. The gate-cut mask 601 may also cover all or a portion of the first set of top hard-masks 402. For example, the gate-cut mask 601 may leave a portion of the first set of top hard-masks 402, which are next to the tip portion of the second set of top hard-masks 502, uncovered or exposed as is illustrated in FIG. 5B. However, embodiments of present invention are not limited in this aspect and, since the tip portion of the second set of top hard-masks 502 are to be removed selectively, relative to the first set of top hard-masks 402, the gate-cut mask 601 may not need to cover, and so in one embodiment does not cover, the first set of top hard-masks 402.

Figures 6A, 6B, 6C, 6D:
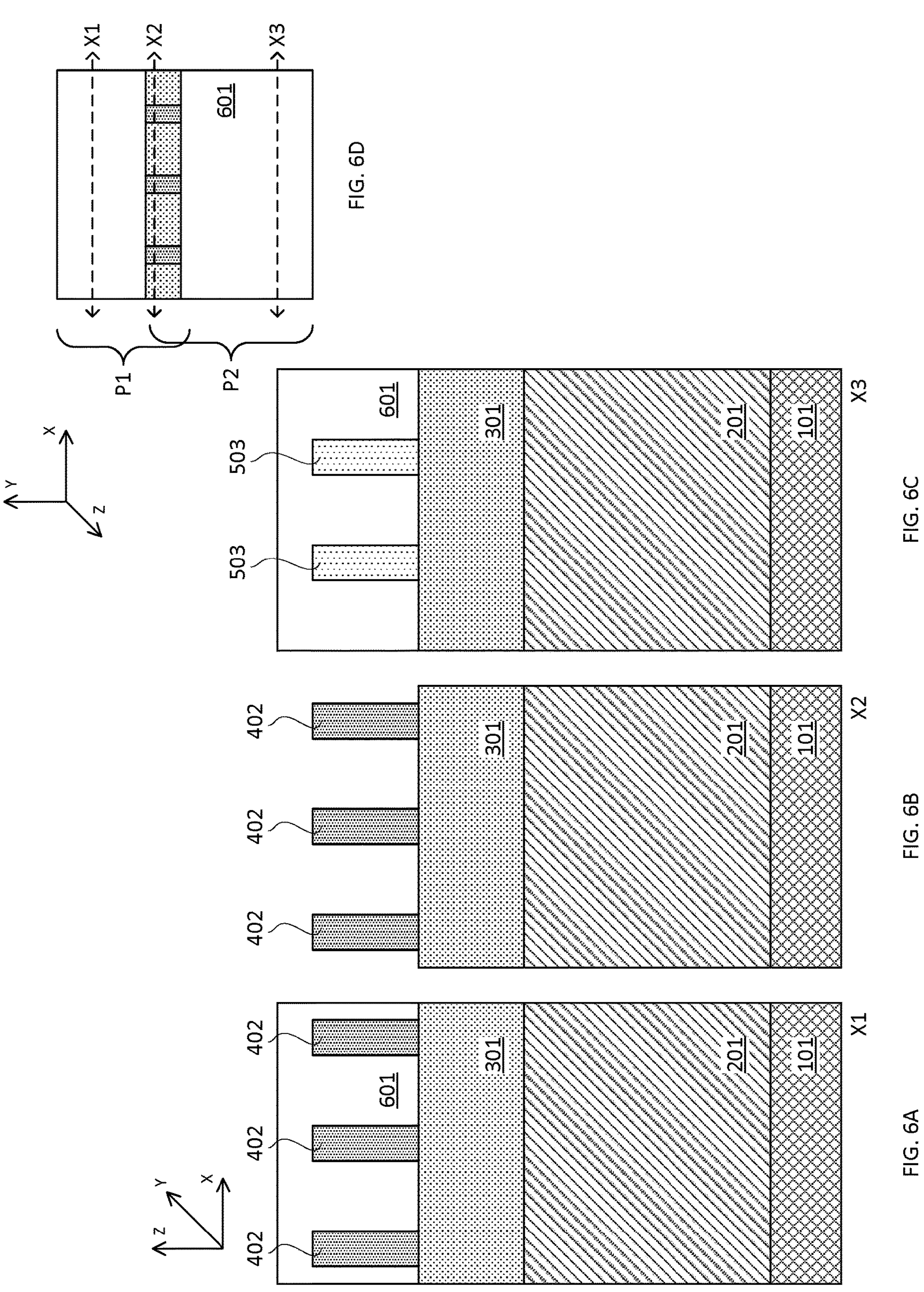
FIGS. 6A, 6B, and 6C are demonstrative illustrations of cross-sectional views
FIG. 6D is a demonstrative illustration of a top view of a semiconductor structure in a step of manufacturing thereof according to embodiments of a method of present invention.

FIGS. 6A, 6B, and 6C are demonstrative illustrations of cross-sectional views and FIG. 6D is a simplified illustration of top view of a semiconductor structure in a step of manufacturing thereof according to one embodiment of present invention. More specifically, following the step illustrated in FIGS. 5A-5D, embodiments of present invention provide selectively removing, such as through a selective etching process, the tip portion of the second set of top hard-masks 502, as are illustrated in FIG. 6B and FIG. 6D, to produce a modified second set of top hard-masks 503. However, embodiments of present invention are not limited in this aspect and in one embodiment, the first set of top hard-masks 402 may be fully covered by the gate-cut mask 601 and a partial selective etching process, selective only to the blanket gate hard-mask layer 301, may be used to remove the tip portion of the second set of top hard-masks 502 in producing the modified second set of top hard-masks 503, without affecting the first set of top hard-masks 402.

Figures 7A, 7B, 7C, 7D:
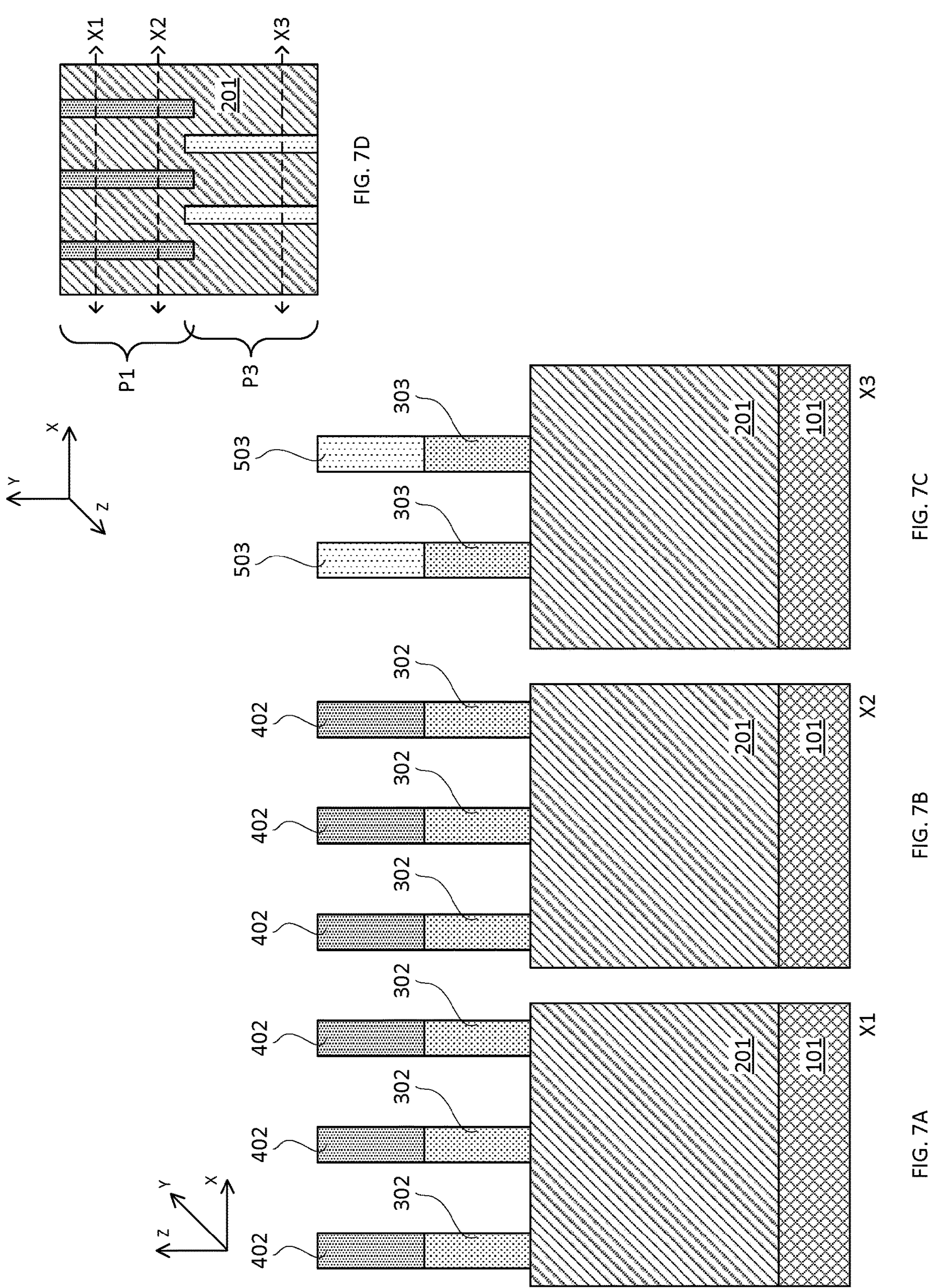
FIGS. 7A, 7B, and 7C are demonstrative illustrations of cross-sectional views
FIG. 7D is a demonstrative illustration of a top view of a semiconductor structure in a step of manufacturing thereof according to embodiments of a method of present invention.

FIGS. 7A, 7B, and 7C are demonstrative illustrations of cross-sectional views and FIG. 7D is a simplified illustration of top view of a semiconductor structure in a step of manufacturing thereof according to one embodiment of present invention. More specifically, following the step illustrated in FIGS. 6A-6D, embodiments of present invention provide removing the gate-cut mask 601 to expose the underneath blank gate hard-mask layer 301 and transferring the pattern of gate structures that are represented by the first and the modified second sets of top hard-masks 402 and 503 to the blanket gate hard-mask layer 301 and produce a first set of gate masks 302 and a second set of gate masks 303. Here it is to be noted that the tip portion of the second set of gate masks 303 may be aligned with the tip portion of the first set of gate masks 302. However, embodiments of present invention are not limited in this aspect, and in one embodiment the tip portion of the second set of gate masks 303 may partially overlap with the tip portion of the first set of gate masks 302. This is because during the removal process of the tip portion of the second set of top hard-masks 502, the portion being removed is only needed to such extent that a gate of a first transistor, formed from one of the gate masks 303, may not interfere with a source/drain region of a second transistor, which is vertically next to the first transistor, and the source/drain region of the second transistor is formed between two of the gate masks 302.

Figures 8A, 8B, 8C, 8D:
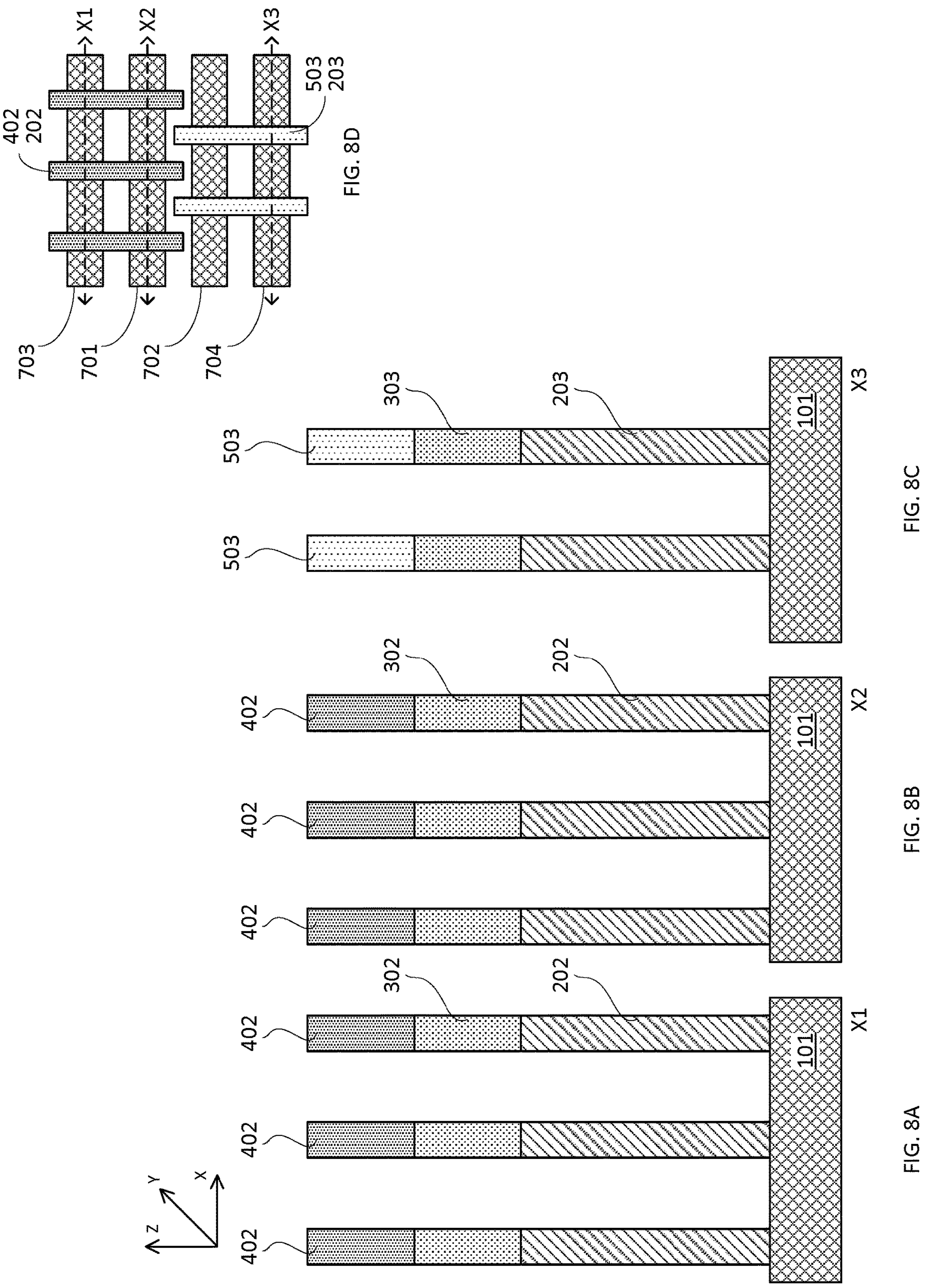
FIGS. 8A, 8B, and 8C are demonstrative illustrations of cross-sectional views
FIG. 8D is a demonstrative illustration of a top view of a semiconductor structure in a step of manufacturing thereof according to embodiments of a method of present invention.

FIGS. 8A, 8B, and 8C are demonstrative illustrations of cross-sectional views and FIG. 8D is a simplified illustration of top view of a semiconductor structure in a step of manufacturing thereof according to one embodiment of present invention. More specifically, following the step illustrated in FIGS. 7A-7D, embodiments of present invention provide transferring the pattern of the first set of gate masks 302 and the second set of gate masks 303 onto the blanket dummy gate layer 201 thereby producing a first set of dummy gates 202 and a second set of dummy gates 203. As is demonstratively illustrated in FIG. 8D, the first set of dummy gates 202 vertically above a first substrate region 701 and a third substrate region 703 of the semiconductor substrate 101, and the second set of dummy gates 203 situate vertically above a second substrate region 702 and a fourth substrate region 704 of the semiconductor substrate 101. The first, second, third, and fourth substrate regions 701, 702, 703, and 704 may be arranged to be parallel to each other.

Figure 9:
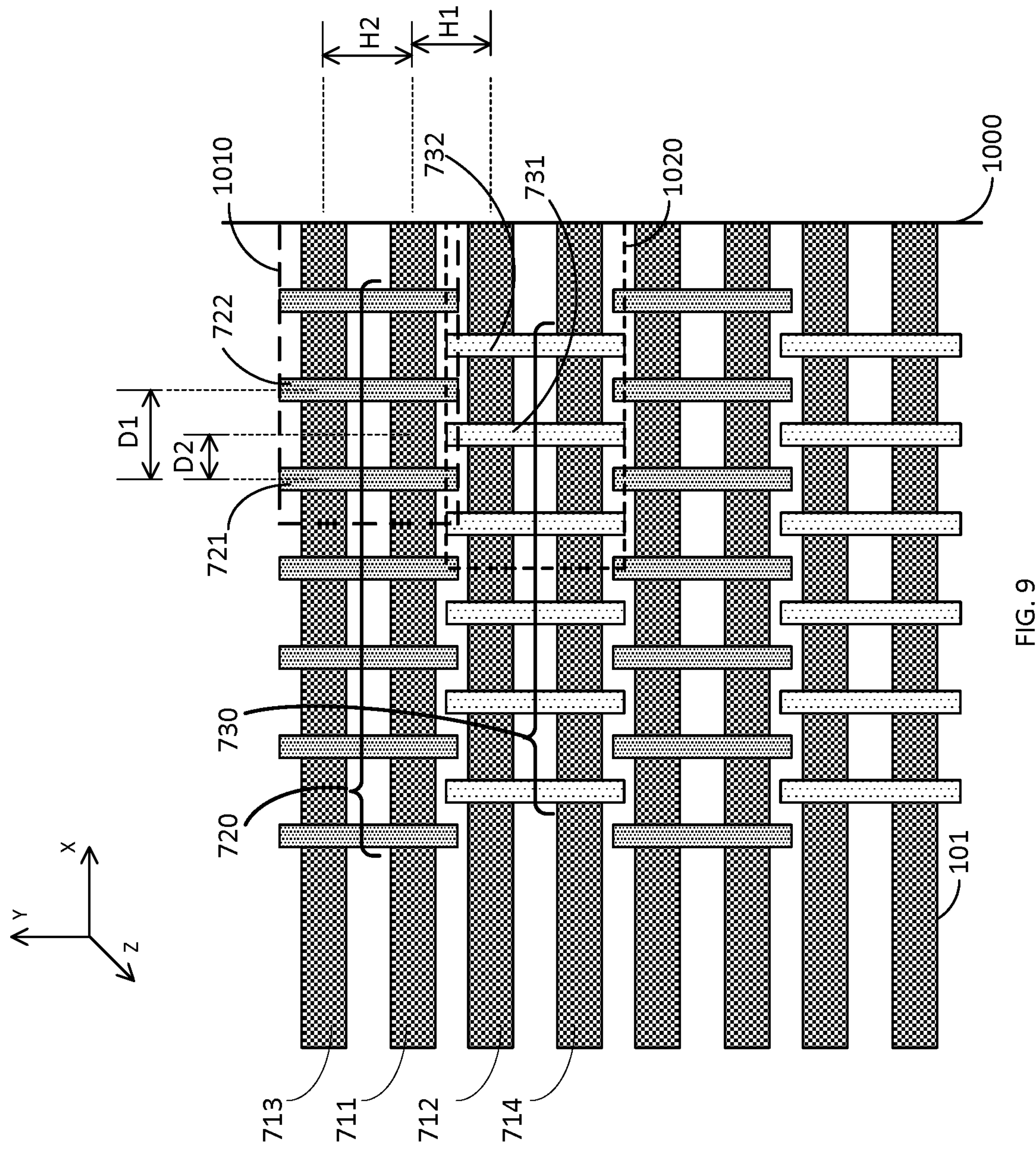
FIG. 9 is a demonstrative illustration of a top view of a semiconductor structure according to one embodiment of present invention.

FIG. 9 is a simplified illustration of top view of a semiconductor structure in a step of manufacturing thereof according to one embodiment of present invention. More specifically, following the step illustrated in FIGS. 8A-8D, embodiments of present invention provide finishing forming a first, a second, a third, and a fourth row of transistor array 711, 712, 713, and 714 in the first, the second, the third, and the fourth substrate region 701, 702, 703, and 704 respectively. More particularly, the first row of transistor array 711 and the third row of transistor array 713 may share a first set of gates 720, which may include for example a first gate 721 and a second gate 722, formed from the first set of dummy gates 202. Similarly, the second row of transistor array 712 and the fourth row of transistor array 714 may share a second set of gates 730, which may include for example a third gate 731 and a fourth gate 732, formed from the second set of dummy gates 203.

In the horizontal direction, that is, in the x-direction, an edge or end of the first set of gates 720 may be aligned with an edge or end of the second set of gates 730 in one embodiment, and in another embodiment gates in the first set of gates 720 and gates in the second set of gates 730 may partially overlap with each other. In the same horizontal direction, the first set of gates 720 shared by the first and third rows of transistor arrays 711 and 713 may be interdigitated with the second set of gates 730 shared by the second and fourth rows of transistor arrays 712 and 714. In other words, gates in the first set of gates 720 are not aligned with gates in the second set of gates 730 along a y-direction, which is perpendicular to the x-direction. As illustrated in FIG. 9, x-direction represents direction of the transistor arrays such as the first and second rows of transistor arrays 711 and 712 and y-direction represents a width direction of the first and second sets of gates 720 and 730.

In one embodiment, the first gate 721 and the second gate 722 in the first row of transistor array 711 may be separated by a first distance D1 and the third gate 731 in the second row of transistor array 712 may be separated by a second distance D2, horizontally, from the first gate 721 in the first row of transistor array 711, and the second distance D2 may equal to half of the first distance D1.

In one embodiment, the first row of transistor array 711 may be arranged to be adjacent and parallel to the second row of transistor array 712; the third row of transistor array 713 may be arranged to be adjacent and parallel to the first row of transistor array 711; and the fourth row of transistor array 714 may be arranged to be adjacent and parallel to the second row of transistor array 712. By placing or arranging the first set of gates 720 in a staggered way with the second set of gates 730, in other words by offsetting the second set of gates 730 some distance, such as a distance D2, from the first set of gates 720, a first distance H1 between the first row of transistor array 711 and the second row of transistor array 712 may be made to be different from a second distance H2 between the first row of transistor array 711 and the third row of transistor array 713, or at least made shorter than a distance that would otherwise be made in a conventional gate-cutting process. In other words, the rows of transistor arrays may be more densely placed next to each other. In one embodiment, the first distance H1 may be made to be shorter than the second distance H2.

In one embodiment, transistors in the first row of transistor array 711 may be n-type transistors; transistors in the second row of transistor array 712 may be n-type transistors; and transistors in the third row of transistor array 713 may be p-type transistors. In other words, the transistors in the first row of transistor array 711 and in the second row of transistor array 712 may be a same type of transistors or have a same polarity; and the transistors in the first row of transistor array 711 and in the third row of transistor array 713 may be different types of transistors or have opposite polarities. In another embodiment, the transistors in the first row of transistor array 711 and in the second row of transistor array 712 may be different types of transistors, such as n-type and p-type respectively, or in other words have opposite polarities.

In one embodiment, the first and third rows of transistor arrays 711 and 713 may include a first edge cell 1010 and the second and fourth rows of transistor arrays 712 and 714 may include a second edge cell 1020. The first edge cell 1010 and the second edge cell 1020 may be aligned to a block level boundary 1000.

Figure 10:
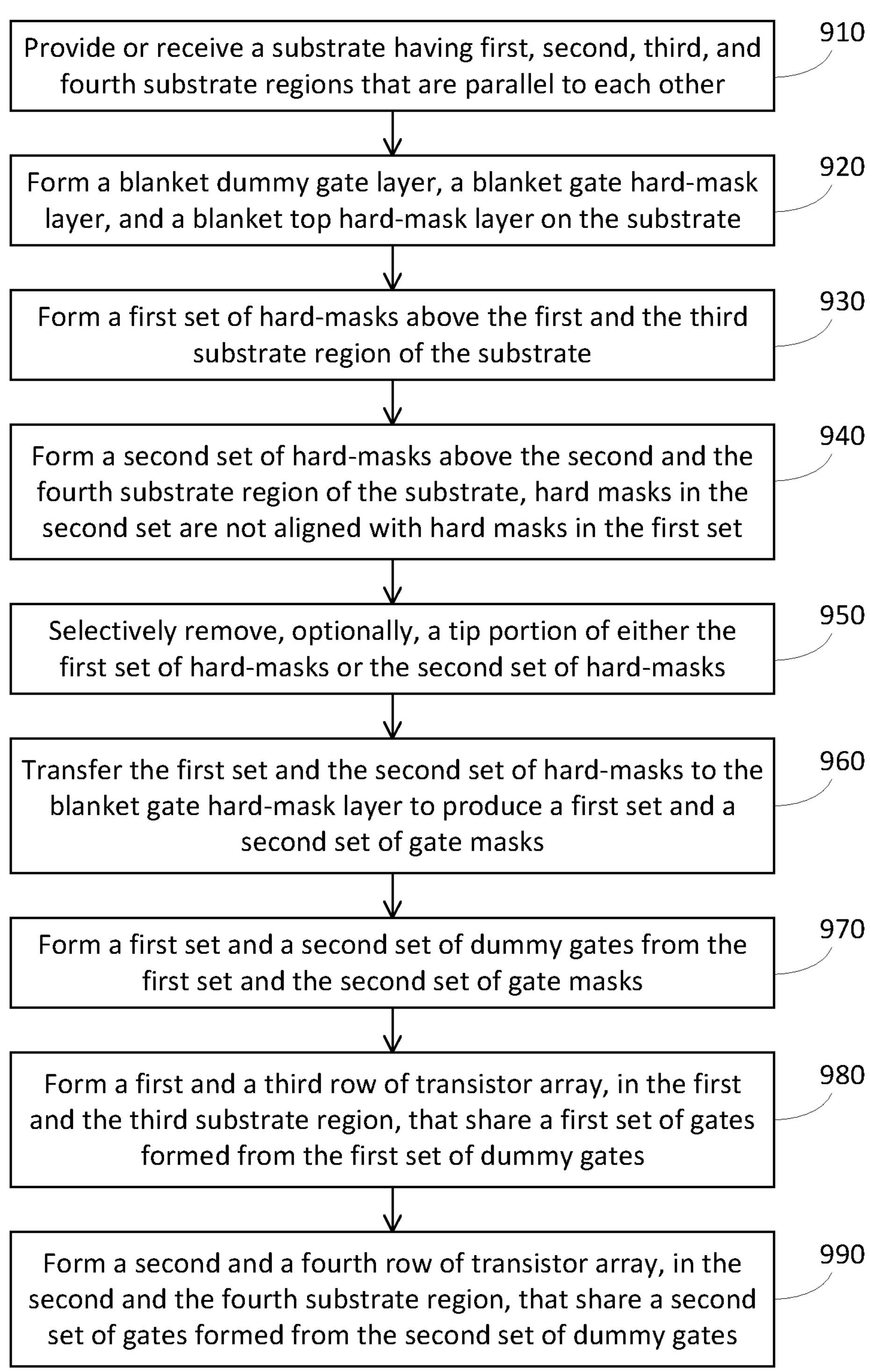
FIG. 10 is a demonstrative illustration of a flow-chart of a method of manufacturing a semiconductor structure according to embodiments of present invention.

FIG. 10 is a demonstrative illustration of a flow-chart of a method of manufacturing a semiconductor structure according to embodiments of present invention. The method includes (910) providing or receiving a semiconductor substrate, the semiconductor substrate including first, second, third, and fourth substrate regions that are parallel to each other for forming four rows of transistor arrays; (920) forming a blanket dummy gate layer on top of the semiconductor substrate, a blanket gate hard-mask layer on top of the blanket dummy gate layer, and a blanket top hard-mask layer on top of the blanket gate hard-mask layer; (930) forming a first set of hard-masks above the first and the third substrate region of the substrate; (940) forming a second set of hard-masks above the second and the fourth substrate region of the substrate, where hard-masks in the second set of hard-masks are not aligned with hard-masks in the first set of hard-masks; (950) selectively removing, optionally, a tip portion of either the first set of hard-masks or the second set of hard-masks such that, for example, gates of a second row of transistor arrays, whose positions are defined by the second set of hard-masks, do not interfere or overlap with source/drain regions of a first row of transistor array; (960) transferring the first set and the second set of hard-masks to the blanket gate hard-mask layer to produce a first set and a second set of gate masks; (970) forming a first set and a second set of dummy gates from the first set and the second set of gate masks; (980) forming a first and a third row of transistor arrays, in the first and third substrate regions, that share a first set of gates formed from the first set of dummy gates; and (990) forming a second and a fourth row of transistor arrays, in the second and fourth substrate regions, that share a second set of gates formed from the second set of dummy gates.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:

a first row of transistor array; and a second row of transistor array, the second row of transistor array being adjacent to and parallel to the first row of transistor array in a first direction, wherein gates of the first row of transistor array partially overlap, in the first direction, with gates of the second row of transistor array, and the gates of the first row of transistor array are not aligned with the gates of the second row of transistor array.

2. The semiconductor structure of claim 1, further comprising a third row of transistor array that is adjacent to and parallel to the first row of transistor array and shares the gates of the first row of transistor array, wherein a first distance between the first row of transistor array and the second row of transistor array is different from a second distance between the first row of transistor array and the third row of transistor array.

3. The semiconductor structure of claim 2, further comprising a fourth row of transistor array that is adjacent to and parallel to the second row of transistor array and shares the gates of the second row of transistor array, wherein the first distance between the first row of transistor array and the second row of transistor array is different from a third distance between the second row of transistor array and the fourth row of transistor array.

4. The semiconductor structure of claim 2, wherein transistors in the first row of transistor array have a same polarity as transistors in the second row of transistor array, and have a different polarity from transistors in the third row of transistor array.

5. The semiconductor structure of claim 1, wherein the gates of the first row of transistor array includes a first gate and a second gate that are separated by a first distance, the gates of the second row of transistor array includes a third gate that has a second distance from the first gate of the first row of transistor array, wherein the second distance equals half of the first distance.

6. The semiconductor structure of claim 1, wherein the first row of transistor array includes at least a first edge cell, and the second row of transistor array includes at least a second edge cell, the first edge cell and the second edge cell are aligned at a block level boundary.

7. A semiconductor structure comprising:

a first row of transistor array, a second row of transistor array, a third row of transistor array, and a fourth row of transistor array that are arranged to be parallel to each other in a first direction, the first row of transistor array and the third row of transistor array sharing a first set of gates and the second row of transistor array and the fourth row of transistor array sharing a second set of gates, wherein an edge of the first set of gates is aligned with an edge of the second set of gates in the first direction and the first set of gates are not aligned with the second set of gates in a second direction perpendicular to the first direction.

8. The semiconductor structure of claim 7, wherein a first distance between the first row of transistor array and the second row of transistor array is shorter than a second distance between the first row of transistor array and the third row of transistor array and is shorter than a third distance between the second row of transistor array and the fourth row of transistor array.

9. The semiconductor structure of claim 7, wherein transistors in the first row of transistor array have an opposite polarity with transistors in the second row of transistor array and have an opposite polarity with transistors in the third row of transistor array.

10. The semiconductor structure of claim 7, wherein the first set of gates in the first row of transistor array includes a first gate and a second gate that are horizontally separated by a first distance, the second set of gates in the second row of transistor array includes a third gate that has a second distance from the first gate in the first row of transistor array, wherein the second distance equals half of the first distance.

11. The semiconductor structure of claim 7, wherein the first row of transistor array includes a first edge cell and the second row of transistor array includes a second edge cell, the first edge cell and the second edge cell are vertically aligned at a block level boundary.

* * * * *